(12) United States Patent
Martin et al.

(10) Patent No.: US 7,898,284 B2
(45) Date of Patent: Mar. 1, 2011

(54) ASYNCHRONOUS NANO-ELECTRONICS

(75) Inventors: Alain J. Martin, Pasadena, CA (US); Piyush Prakash, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 707 days.

(21) Appl. No.: 11/940,027

(22) Filed: Nov. 14, 2007

(65) Prior Publication Data

US 2010/0283502 A1    Nov. 11, 2010

Related U.S. Application Data (60) Provisional application No. 60/858,859, filed on Nov. 14, 2006.

(51) Int. Cl.
 *H03K 19/003* (2006.01)
(52) U.S. Cl. .................... 326/9; 326/10; 326/41
(58) Field of Classification Search ........... 326/9–15, 326/112
 See application file for complete search history.

(56) References Cited

U.S. PATENT DOCUMENTS

| | | | |
|---|---|---|---|
| 7,036,059 B1 | 4/2006 | Carmichael et al. | |
| 7,301,362 B2 * | 11/2007 | Jang et al. | 326/9 |
| 7,504,851 B2 * | 3/2009 | Manohar et al. | 326/9 |
| 7,505,304 B2 * | 3/2009 | Manohar et al. | 365/154 |
| 2005/0127971 A1 | 6/2005 | Hoff | |

OTHER PUBLICATIONS

Martin et al., "Asynchronous Techniques for System-on-Chip Design", Proceedings of the IEEE, Special Issue on Systems-on-Chip, 94, 6, 1089-1120, 2006.
DeHon, "Nanowire-Based Programmable Architectures", J. of Emerging Technolgies in Computer Systems, 2005.
Snider et al., CMOS-like logic in defective, nanoscale crossbars, Nanotechnology, 15, 881-891-, 2004.
Stan et al., "Molecular Electronics: From Devices and Interconnect to Circuits and Architecture", Proceedings of the IEE, 91, 11, 1940-1957, 2003.

* cited by examiner

*Primary Examiner*—Rexford N Barnie
*Assistant Examiner*—Crystal L Hammond
(74) *Attorney, Agent, or Firm*—Milstein Zhang & Wu LLC; Joseph B. Milstein (57) ABSTRACT

Asynchronous nanoelectronic circuits that operate according to principles of quasi-delay insensitive design are described. Circuit or logic elements comprising n-type devices are fabricated in a first n-plane, p-type devices are fabricated in a p-plane, and connections are formed in a routing plane of a compute tile. A state-holding element comprising a selected one of a C-element, a precharge function-block, and a read-write register is described. The state-holding element can hold a value of an output of a logic element during a time when the output is disconnected from a reference voltage. Isochronic forks having an adversary path designed to make state transitions safe are explained.

13 Claims, 9 Drawing Sheets

ASYNCHRONOUS NANO-ELECTRONICS

CROSS-REFERENCE TO RELATED APPLICATIONS

This application claims priority to and the benefit of co-pending U.S. provisional patent application Ser. No. 60/858,859, filed Nov. 14, 2006, which application is incorporated herein by reference in its entirety. U.S. patent application Ser. No. 11/375,390 filed Mar. 14, 2006 is a related application, which application is incorporated herein by reference in its entirety.

STATEMENT REGARDING FEDERALLY FUNDED RESEARCH OR DEVELOPMENT

The U.S. Government has certain rights in this invention pursuant to Grant No. CCF0541461 awarded by the National Science Foundation.

FIELD OF THE INVENTION

The invention relates to asynchronous circuits in general and particularly to asynchronous circuits comprising nano-technology.

BACKGROUND OF THE INVENTION

Asynchronous circuits operate without a clock. Quasi Delay Insensitive (hereinafter "QDI") circuits are a class of delay-insensitive asynchronous circuit which are invariant to (and make no assumptions about) the delays of any of the circuit's elements, except to assume that certain fanouts are isochronic forks. Isochronic forks allow signals to travel to two (or more) destinations and only receive an acknowledge signal from one. Isochronic forks are forks in circuit elements such as wires. In an isochronic fork, if the acknowledging target has seen a transition on its branch of the fork, then the transition must have also happened on the other branch (or branches) of the fork as well.

Several QDI microprocessors have been designed by compilation of message passing specifications into guarded commands. An example is the Caltech MiniMIPS processor, the first fully QDI processor, which approached commercial MIPS implementations in performance, and worked over a larger range of supply voltages and temperatures.

During demonstrations, the Caltech researchers loaded a simple program which ran in a tight loop, and which pulsed one of the output lines after each instruction. This output line was connected to an oscilloscope. When a cup of hot coffee was placed on the chip, the pulse rate (the effective "clock rate") naturally slowed down to adapt to the worsening performance of the heated transistors. When liquid nitrogen was poured on the chip, the instruction rate increased. Additionally, at lower temperatures, the voltage supplied to the chip could be safely increased, which also improved the instruction rate.

In 2004, Epson manufactured the first flexible microprocessor, an 8-bit asynchronous chip. Synchronous flexible processors cannot be built, since bending the material on which a chip is fabricated causes unpredictable variations in the delays of various transistors, violating the timing assumptions inherent in synchronous design. The Epson processor is intended for use in smart cards, whose chips are currently limited in size to those small enough to remain undistorted.

Some of the benefits provided by QDI circuits include: robust handling of metastability of arbiters; lower power consumption due to the fact that no transistor performs transitions unless it is performing useful computation; elimination of distribution of a high-fanout, timing-sensitive clock signal; elimination of assumptions about the manufacturing process that affect timing; circuit speed that responds to changing temperature and voltage conditions rather than being limited to the slowest speed mandated by worst-case assumptions; immunity to transistor-to-transistor variability in the manufacturing process; and reduction in electro-magnetic interference (or EMI) caused by clocking circuits.

There is a need for asynchronous circuits that can be fabricated in nano-dimensions.

SUMMARY OF THE INVENTION

In one aspect, the invention relates to an asynchronous nanoelectronic circuit configured to operate according to quasi-delay insensitive principles. The circuit comprises a compute tile having an n-plane, a p-plane and a routing plane, the compute tile including at least a first logic element and a second logic element, the first logic element having at least a first input and at least a first output, the second logic element having at least a second input and at least a second output, the first input and the second input each configured to receive an input signal, the first output and the second output each configured to be connected to one of a high reference voltage via a pullup element and a low reference voltage via a pulldown element; and a state-holding element connected to at least one of the first output and the second output, the state-holding element comprising a selected one of a C-element, a pre-charge function-block, and a read-write register, the state-holding element configured to hold steady a state of at least one of the first output and the second output during a time when at least one of the first output and the second output is disconnected from a respective one of the high reference voltage and the low reference voltage. The asynchronous nanoelectronic circuit is configured to provide a computationally stable output according to quasi-delay insensitive principles.

In one embodiment, the precharge function-block comprises a state holding cell having an enable input en and one or more inputs for computing a Boolean function. In one embodiment, the read-write register comprises a set/reset latch having at least two inputs and configured to hold one of two binary values; at least two output elements connected to the set/reset latch, the two output elements configured to provide an output signal and its complement; and a write-acknowledge element, the write-acknowledge element configured to provide a write-acknowledge signal. In one embodiment, each of the first logic element and the second logic element comprise a crossbar having a first wire in a first direction superimposed over a second wire in a second direction orthogonal to the first direction and at least one molecule situated between the first wire and the second wire, the molecule configured to change a conductive state between the first wire and the second wire in response to an applied voltage signal. In one embodiment, the at least one molecule is a rotaxane molecule. In one embodiment, each of said first logic element and said second logic element comprise a crossbar having a first wire in a first direction superimposed over a second wire in a second direction orthogonal to the first direction, wherein at least one of said first and said second wires is a doped silicon nanowire. In one embodiment, a selected one of said first logic element and said second logic element is a selected one of a transistor, a diode and a resistor. In one embodiment, the tile comprises as many as 10,000 logic elements. In one embodiment, the circuit is configured to provide a single-bit register. In one embodiment, the circuit is configured to provide a sum cell. In one embodiment, the circuit is configured to provide a carry cell. In one embodiment, the circuit is configured to provide an adder. In one embodiment, the circuit is configured to provide a logic cell.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals or like symbols are used to indicate like parts throughout the various views, in which:

DETAILED DESCRIPTION OF THE INVENTION

Currently, molecular nanoelectronics is considered a plausible successor to CMOS. It is a mostly non-lithographic bottom-up fabrication technology based on self-assembly of arrays of silicon nanowires (NW) or carbon nanotubes (CNT), whose main potential advantage at the moment is its density. Great parameter variations and high defect rates should be anticipated for this technology, as should be expected for all nanoscale technologies. Because of the expected variations in specimens, timing should be expected to be difficult to control and predict. Molecular nanowires will be short, precluding the implementation of a global clocking network directly in nanoelectronics. In addition, for extremely high densities of electronic elements, the provision of timing signals consumes a great deal of real estate on a chip. Consequently, asynchronous logic is expected to be an ideal, and probably unavoidable choice, for the design of digital circuits in this technology. We discuss implementing asynchronous QDI logic in molecular nanoelectronics, taking into account the restricted geometry, the lack of control on transistor strengths, and the high timing variations. We show that the main building blocks of QDI logic can be successfully implemented. We illustrate the approach with the layout of an adder stage. The techniques we describe are expected to improve the reliability of QDI when applied to nano-CMOS as well.

Although immense fabrication difficulties still lie ahead, at least experimental devices are feasible today. Molecular nanoelectronics is a mostly nonlithographic bottom-up fabrication technology whose main advantage over CMOS is to break the limit of lithography in terms of feature size and device density. Densities in the range of $10^{10}$ to $10^{12}$ devices per $cm^2$ are mentioned in the literature, for example in MR. Stan et al. "Molecular Electronics: From De-vices and Interconnect to Circuits and Architecture," Proceedings of the IEEE, 91, 11, 1940-1957, 2003, and Andre DeHon, "Nanowire-Based Programmable Architectures," J. of Emerging Technologies in Computer Systems, 2005.

All technologies at the nanoscale level, including nano-CMOS, will face great fabrication challenges that will translate into important parameter variations and decreased reliability. As suggested above, timing will be difficult to control and predict, and might be best avoided as a requirement by using QDI principles. Wires will be short, by necessity and by choice: the technology does not allow one to grow long wires reliably and wire delay is quadratic in the wire length. Consequently, it will be difficult (if not impossible) to build a useful global clocking network with those technologies. For those two main reasons difficulty in controlling and predicting timing and impossibility of building a clock network, asynchronous logic is expected to be an ideal and perhaps unavoidable choice for digital circuits in this technology. QDI, which among all types of asynchronous methods, relies on the weakest timing assumption (the isochronic fork), and so is expected to be particularly well suited.

We discuss QDI's robustness to extreme parameter variations and restricted geometry. First, we briefly describe the main features of molecular nanotechnology. Among several possible alternatives we choose a somewhat idealized one based on complementary FETs. We define its main layout rules. Next, we show how to design basic combinational gates. State-holding elements like C-elements and precharge function-blocks require some attention because the traditional "staticizer" implementation should be avoided, as we will explain. We give an implementation for those cells that avoid staticizers. We show how the entire logic family of the Caltech Asynchronous Microprocessor ("CAM"), and the logic family of the MiniMIPS can be both implemented without use of staticizers. We illustrate the design style with the implementation of a ripple-carry adder. Finally, the implementation of isochronic forks with its implied timing assumption is described and analyzed.

Molecular Nanotechnology

Our target technology is an advanced version of the devices produced in the Heath Lab at Caltech, the Lieber Group at Harvard, and the HP group. Chemists are able to grow silicon nanowires with diameters around 5 nm and up to ten microns in length. Those wires can be aligned in one direction, either by a flow process or by nanoimprint. Because of the difficulty in arranging the wires in a regular pattern, the feasible geometry is restricted to a crossbar: a collection of parallel wires in a first direction superimposed with a collection of parallel wires in a second direction orthogonal to the first direction. However, the grid is not perfectly regular and some number of wires may be broken.

Interesting things may be made to happen at the intersection of two orthogonal wires. Special molecules (e.g., rotaxane) can be placed at the crosspoint between two wires and permitted to connect the two wires under controlled conditions. Such a junction is originally of high enough resistance that the two wires are not electrically connected. However, when a high voltage is applied between the two wires, the molecule will begin conducting and will continue to do so when the voltage is lowered. In other words, by applying a suitable voltage at selected junctions, the junctions can be programmed to conduct. The junctions can also be made to rectify, i.e., we can program both resistors and diodes.

Resistors and diodes are sufficient to build a complete logic family and have been used to build programmable logic arrays ("PLAs") and memories. However, a circuit built with only resistors and diodes has no gain (amplification) and therefore signal degradation is unavoidable, leading to failure in any computation containing a significant number of transitions in series. In order to implement general computations, an amplification element such as a transistor is needed. This requirement makes preferable the use of semi-conductors, for example silicon nanowires. Nanowires can be doped during the growth in order to control their conductivity. Heavily doped regions of a wire are conducting. Some regions can be kept lightly doped so as to control their conductivity via an electrical field created by applying a voltage on the crossing metal wire. If a dielectric can be placed between the two wires at their intersection, so as to define a gate, one has effectively created an FET at the junction. So far no technology offers programmable FETs, unlike resistive junctions and diode junctions. It is expected that the technology described herein can provide such a programmable FET structure.

Technologies with one type of transistors (usually pFET), diodes, and resistive pullups or pulldowns have been announced and demonstrated. The transistors have enough gain to build restoring logic. Recently, all three of the Caltech, Harvard and HP groups have announced that they will soon (or already do) fabricate FETs of both n- and p-types, with appropriate threshold voltages and acceptable gain, making it possible to design complementary logic circuits.

We expect that n-type and p-type nano-electronic devices will be built. We also expect that the use of low-resistance metal wires for the grid direction that provides the gates of transistors will be possible. Such metal wires can be obtained either by coating silicon wires with metal during crystal growth, or by imprinting pure metal wires using the nanoimprint technique.

We will now describe the components of our target technology. As already mentioned, we believe that most properties of this technology will apply to nanoCMOS. The basic building block is the tile. A tile is a crossbar array of nanowires: in one embodiment, the (top) horizontal wires are metal conducting wires that are used as gates of transistors; the (bottom) vertical wires are semiconducting silicon nanowires used as channels of transistors. Wire length is expected to be limited, for example to about 10 µm, with a wire-to-wire pitch of approximately 10 nm. Metal wires can be packed more densely and can be longer as they are less resistant. We expect that we can implement tiles of 100×100 wires, or as many as approximately 10,000 intersections (e.g., circuit or logic elements) per tile.

A tile may be a routing tile or a compute tile. A routing tile contains only programmable junctions and is used to connect two compute tiles. A compute tile comprises an n-plane, a p-plane, and a routing plane. An n-plane contains n-transistors only; a p-plane contains p-transistors only; a routing plane contains programmable connections only.

An important advantage of this technology is that the different active crosspoints (e.g., transistors, resistors, diodes) fit exactly under the area of the crosspoint and therefore do not increase the area of the array, thereby contributing to the density advantage of the technology.

A few important assumptions and properties should be mentioned.

1. It is believed that it is not possible to mix the different components (e.g., n-transistor, p-transistor, resistor) inside the same plane. Each plane is homogeneous.
2. It is in general believed that it is not possible to connect wires end-to-end in one direction. Connections are made through orthogonal wires.
3. It is believed that connection resistance is high (100 KΩ) and highly variable.
4. It is believed that the drive of transistors is not well characterized. We expect that the limit to the number of transistors in series is similar to CMOS. For the present discussion, we have chosen 3 transistors in series as a hard limit.
5. It is believed that up to 10% of the wires and connections may be broken or stuck open.
6. In one embodiment, the collection of nanotiles is fabricated or placed on top of a standard silicon layer. Power distribution and input/output are implemented in the silicon layer. All vertical nanowires in a p-plane are connected to a micro-wire distributing $V_{dd}$, and all vertical nanowires in an n-plane are connected to a micro-wire distributing GND.

Implementing QDI Logic

Among all asynchronous logic families, QDI is the most robust to parameter variations because it relies on the weakest timing assumption: the isochronic fork. However in the presence of the extreme variations in pressure, voltage and temperature that are to be expected in nanotechnology processing methods, even QDI may have to be improved.

Combinational Cells

Figure 1:
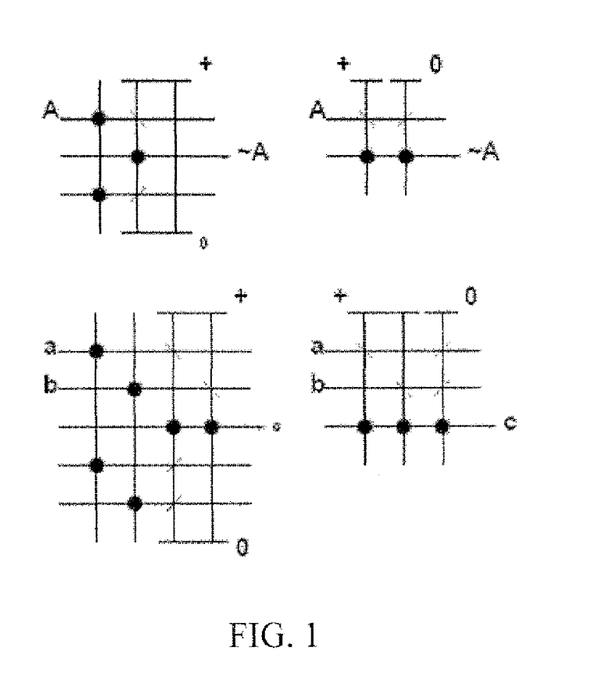
FIG. 1 is a schematic diagram that illustrates two possible layouts for the inverter (top two diagrams) and nand2 (lower two diagrams) gates, according to principles of the invention.
Figure 2:
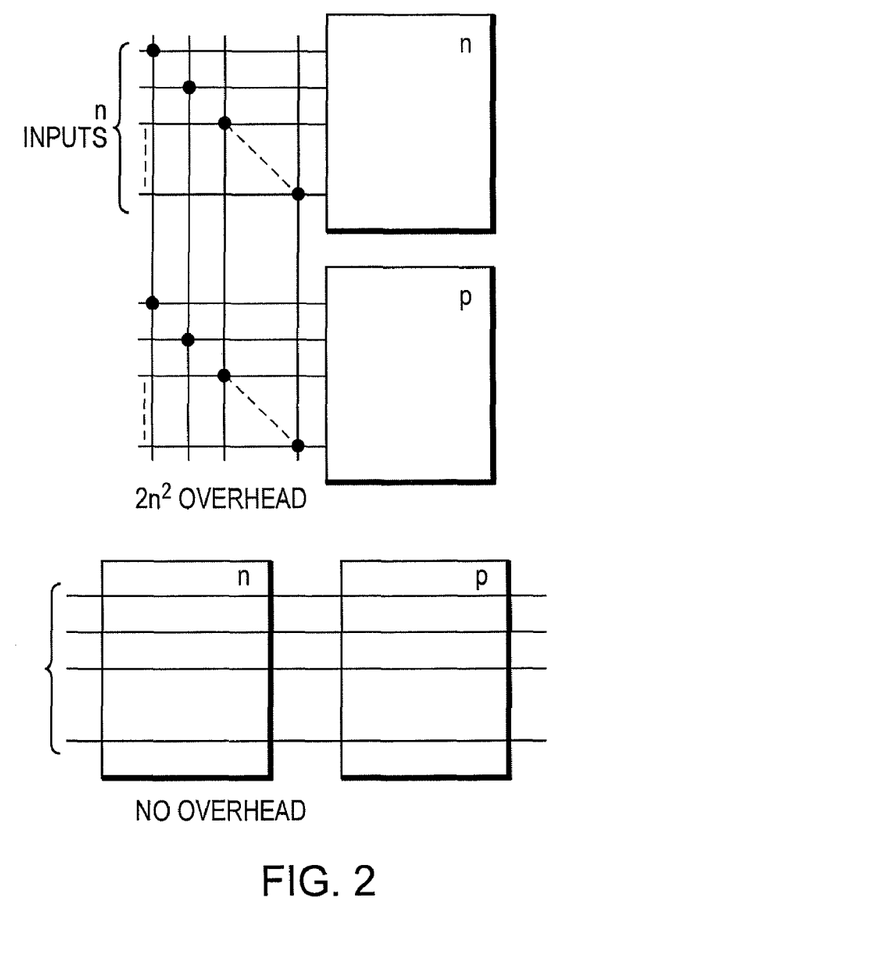
FIG. 2 is a schematic diagram that illustrates two possible layouts for an n-input cell, according to principles of the invention.

The implementation of combinational cells does not present any particular problem beside the usual restriction on the length of transistor chains, but it gives us the opportunity to fix a general layout scheme. FIG. 1 shows two alternative implementations for the inverter and the nand2 In the two top panes of FIG. 1 inverters that accept a value A as input and provide a value ~A as output are shown. In the lower two panes of FIG. 1, circuits having inputs a and b and an output c are shown. The nor2 gate is derived from the nand2 by exchanging $V_{dd}$ and GND, and p- and n-transistors. In general, in the figures given in his application, a dot at the intersection of two wires indicates a connection, a diagonal bar (/ or "forward slash")) indicates an n-transistor, and a diagonal bar (\ or "back slash") indicates a p-transistor. In FIG. 1, in the left-most layouts (i.e., a first type of layout), the n- and p-planes are vertically aligned with respect to the metal wires;

in the right-most layouts (i.e., a second type of layout), they are horizontally aligned with respect to the metal wires. It is clear that the second choice of layout presents an important area advantage: the area of the nand-gate is 6×3 in the first case and 2×3 in the second case. As shown in FIG. 2, the penalty of the first layout for an n-input combinational gate is $2n^2$. But there is another, more important, advantage to the second layout choice. If an input is shared by several transistor gates, then in the second layout choice, the input signals to the different gates are carried by the same metal wire, resulting in very similar RC characteristics for the different paths. In the first layout choice, the paths from one input to several transistor gates are very dissimilar, with the paths to one type of transistors going through two resistive contacts and the paths to the other type of transistors being a single metal wire. As we shall see, this difference is important for the implementation of isochronic forks.

General Layout Scheme

Figure 3:
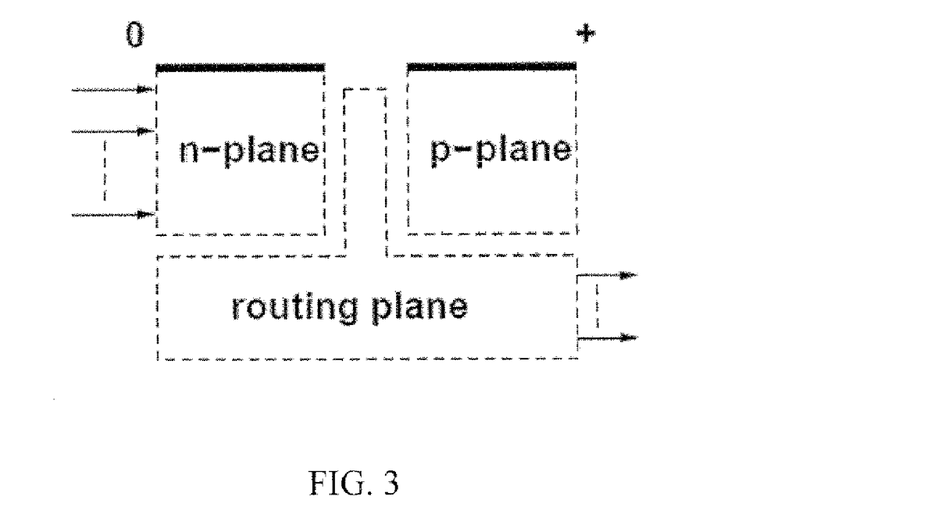
FIG. 3 is a schematic diagram that illustrates a general layout scheme for a compute tile, according to principles of the invention.

The general scheme for a compute tile is shown in FIG. 3. The two transistor planes are side by side with the input signals running horizontally on metal wires. Each vertical semiconductor wire of the transistor planes can be used inside a transistor plane as a pullup or pulldown transistor chain if transistors are placed at some of the cross-points. Because of the restricted geometry, parallel chains cannot share any overhead transistors, and therefore all Boolean expressions are implemented in the disjunctive normal form: The expression $a \wedge (b \vee c)$ can only be implemented as $(a \wedge b) \vee (a \wedge c)$. The general shape of the routing plane is that of an inverted T as shown in FIG. 3. In the embodiment shown, the part of the routing plane between the two transistor planes is used only for the feedback connections needed in the implementation of state-holding gates. The bottom part of the routing plane connects the pullup and pulldown chains to the output(s) of the logic gate. A similar scheme has been proposed in Greg Snider et al., Nanotechnology, 15, 881-891, 2004. A single compute tile usually accommodates several cells.

State-Holding Operators

The standard CMOS implementation of state-holding operators in this technology presents a difficulty relating to the weak inverter of the staticizer. Consider the operator defined by the two production rules:

$A \rightarrow x \uparrow$ $B \rightarrow x \downarrow$

Without loss of generality, we can assume that it is implemented as $A \rightarrow x\_\downarrow\; x\_\rightarrow x \downarrow$ $B \rightarrow x\_\uparrow\; \neg x\_\rightarrow x \uparrow$ By definition of a state-holding element, there exist states in the computation where $\neg A \wedge \neg B$ holds. In those "floating" states, the path to $V_{dd}$ through the pullup implementing B, and the path to GND through the pulldown A are both cut. The voltage the value of the physical node implementing x_ has to be maintained in other ways. The general approach is to find another path to $V_{dd}$ and another path to GND to maintain the current value of x_. The simplest and most crude solution is to add a "staticizer" (or "keeper"). The staticizer implementation comprises maintaining the current value of x_ by adding the pullup $\neg x \rightarrow x\_\uparrow$ and the pulldown $x \rightarrow x\_\downarrow$, giving the gate:

$A \vee x \rightarrow x\_\downarrow$ $B \vee \neg x \rightarrow x\_\uparrow$

The added circuitry is a feedback inverter with input x and output x_. The difficulty with this solution is that when the value of x_ has to be changed, for instance from true to false, there is a conflict (a "fight") between $A \rightarrow x\_\downarrow$, and $\neg x \rightarrow x\_\uparrow$. Symmetrically, when the value of x_ has to be changed from false to true, there is a "fight" between $B \rightarrow x\_\uparrow$ and $x \rightarrow x\_\downarrow$. There is no logical resolution to those conflicts. They can only be resolved by physical means by making sure that the current through the pullup implementing B and through the pulldown implementing A is stronger than the current through the feedback inverter. This is usually achieved by implementing the two transistors of the feedback inverter as highly resistive ("weak"), making the currents through the pullup and the pulldown of the feedback much smaller than the currents through the pullup B and pulldown A. But the weak currents cannot be too weak since they have to maintain the voltage on node x_ in the presence of possibly important leakage. Hence we have a two-sided inequality requirement on the feedback inverter's current. In a technology where the physical parameters of the design are very hard to control, it would be very risky to rely on the relative strengths of conducting paths, besides the fact that transistors cannot be accurately and reliably sized. We conclude that one will not be able to use a staticizer in nanotechnology.

Figure 4:
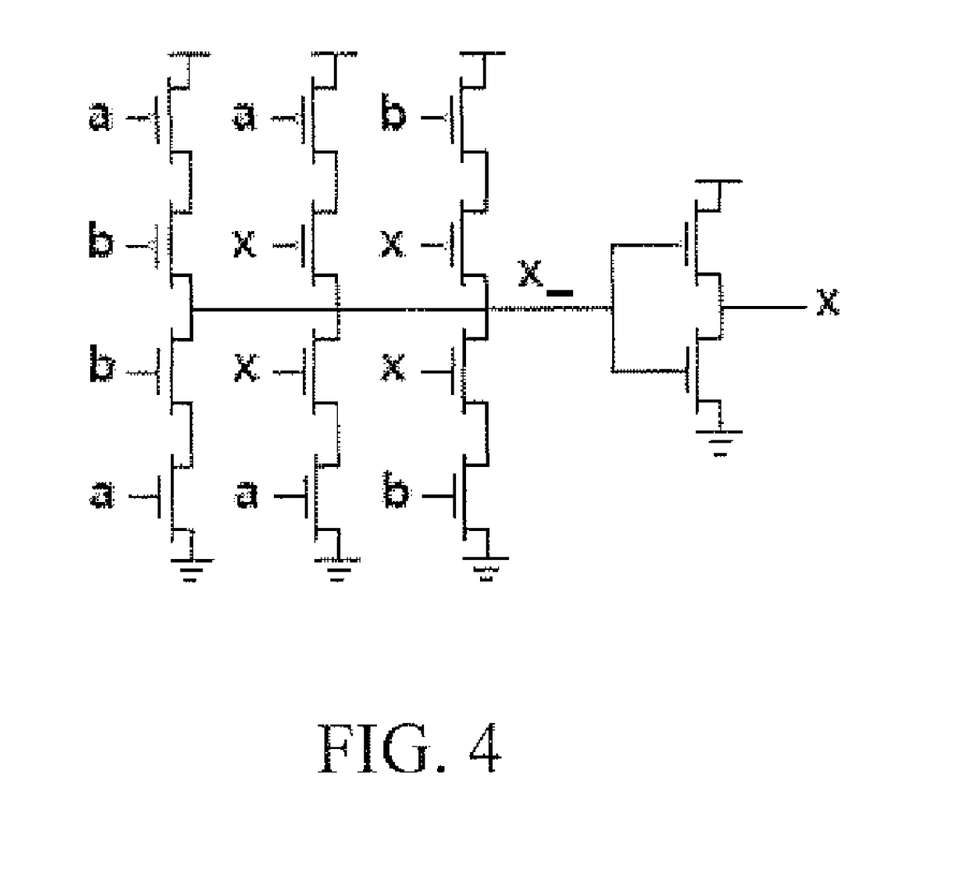
FIG. 4 is a schematic diagram that illustrates a two-input C-element implemented as a majority gate, according to principles of the invention.
Figure 5:
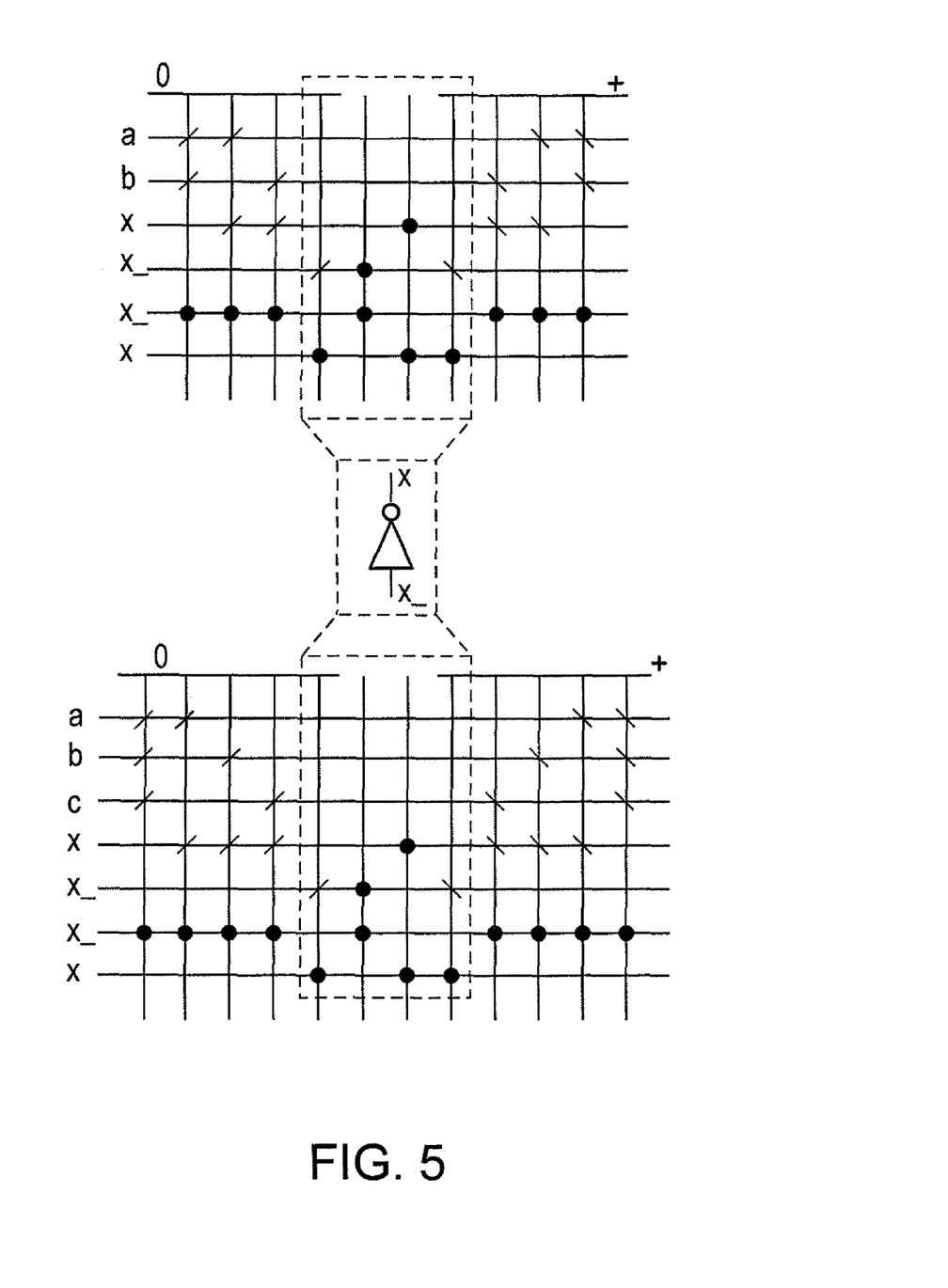
FIG. 5 is a schematic diagram that illustrates 2-input and a 3-input C-elements, in which the central part is used for feedback paths, according to principles of the invention.

We have to use another solution to maintain the value of the output nodes in the floating states. The general method involves identifying the floating states in which the value of the output has to be maintained and using the feedback inverter only in those states. Without additional information, floating states are characterized by $\neg A \wedge \neg B$, leading to the general solution:

$A \vee \neg B \wedge x \rightarrow x\_\downarrow$ $B \vee \neg A \wedge \neg x \rightarrow x\_\uparrow$ C-Element The Muller C-element is an essential building block of asynchronous logic. The 2-input C-element with inputs a and b and output x is defined as:

$a \wedge b \rightarrow x \uparrow$ $\neg a \wedge \neg b \rightarrow x \downarrow$ The above transformation applied to this pair of production rules leads to the well-known majority-gate implementation (see FIG. 4):

$a \wedge b \vee a \wedge x \vee b \wedge x \rightarrow x\_\downarrow$ $\neg a \wedge \neg b \vee \neg a \wedge \neg x \vee \neg b \wedge \neg x \rightarrow x\_\uparrow$ $x\_\rightarrow x \downarrow$ $\neg x\_\rightarrow x \uparrow$ For the three-input C-element, the transformation gives:

$a \wedge b \wedge c \vee a \wedge x \vee b \wedge x \vee c \wedge x \rightarrow x\_\downarrow$ $\neg a \wedge \neg b \wedge \neg c \vee \neg a \wedge \neg x \vee \neg b \wedge \neg x \vee \neg c \wedge \neg x \rightarrow x\_\uparrow$ The layout of the C-elements in FIG. 5 shows the use of the midsection of the routing plane for feedback connections (using the output x as gate of some transistors).

Read/Write Register

A read/write register is used in a standard pipeline stage of the Caltech Asynchronous Microprocessor. It is also used in a slightly different form to implement general-purpose registers in the MiniMIPS and Lutonium.

Figure 6:
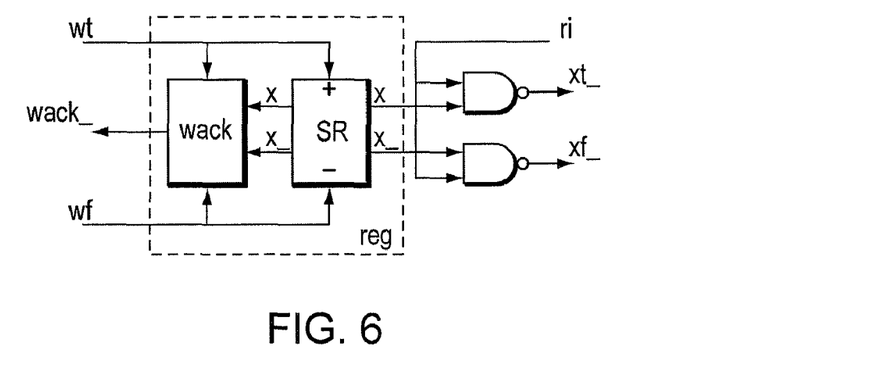
FIG. 6 is a schematic diagram that illustrates a dual-rail single-bit register with read and write interfaces, according to principles of the invention.

As shown in FIG. 6, in its simplest form, the register comprises three parts: the set/reset latch maintaining the current value of the register bit (x, x_), the two nand-gates that constitute the read part, and the write-acknowledge (wack) cell that generates the acknowledge signal for the write handshake. The implementation of the read part presents no difficulty. The set/reset latch is implemented as cross-coupled nor-gates (see A. J. Martin, M. Nystrom, Asynchronous Techniques for System-on-Chip Design, Proceedings of the IEEE, Special Issue on Systems-on-Chip, 94, 6, 1089-1120, 2006). Only the wack needs some attention. Its specification is $$wt \wedge x \vee wf \wedge x \rightarrow wack\_\downarrow$$

$$\neg wt \wedge \neg wf \rightarrow wack\_\uparrow$$

The floating states are $\neg wt \wedge wf \wedge \neg x\_$ and $wt \wedge \neg wf \wedge \neg x$. In both states, the write interface is in the process of changing the values of x and x_ and therefore the output wack_ should be kept high in the floating states. The transformation then gives $$\neg wt \wedge \neg wf \vee \neg wt \wedge \neg x\_ \vee \neg wf \wedge \neg x \rightarrow wack\_\uparrow$$

Figure 7:
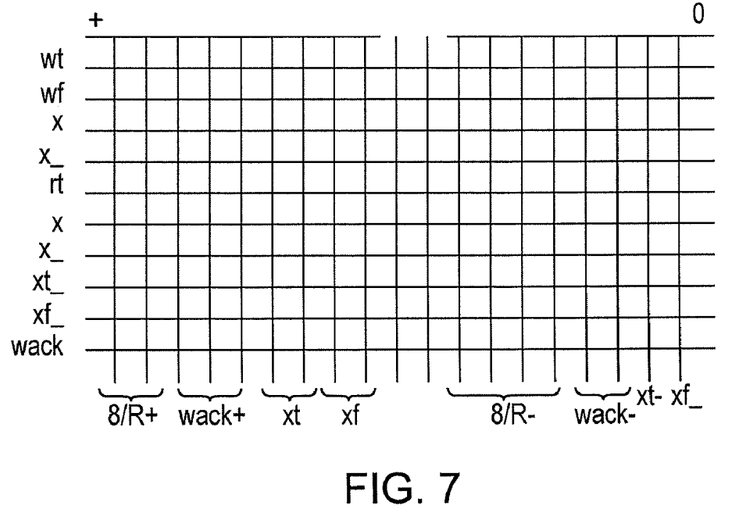
FIG. 7 is a schematic diagram for the dual-rail read/write register of FIG. 6, according to principles of the invention.

Now the two guards are complementary. The write-acknowledge is a combinational gate. Altogether the above design leads to a compact nano layout for the register. No feedback inverter is needed, the only feedback being that of the cross-coupled nor-gates, and there are at most two transistors in series on all paths. See FIG. 7.

Precharge Function-Block

We know that we can implement all computations that don't require arbitration with just standard combinational gates and the 2-input C-element. However, performance will suffer. It takes just a few additional cells to allow efficient circuit implementations. For instance, the C-element, the set-reset latch and the precharge function-block are enough to implement the circuits of the Caltech MiniMIPS as well as the circuits of the Caltech Asynchronous Microprocessor even though the two design styles are different. The set-reset latch can be implemented with cross-coupled nor-gates. The precharge function-block is a state-holding cell with two sets of inputs: the input en is a control signal used to precharge the output node z high in the neutral state ($\neg en$). The other set X of inputs is used to compute the Boolean function F when en is high. Function F is necessarily small enough to fit in a single pulldown, and therefore the number of inputs of X is also limited—rarely more than four. The production rules for the precharge function-block cell are:

$$\neg en \rightarrow z\_\uparrow \; z\_\rightarrow z\downarrow$$

$$en \wedge F \rightarrow z\_\downarrow \; \neg z\_\rightarrow z\uparrow$$

The floating state is $en \wedge \neg F$. Applying the transformation and after simplification, we get:

$$\neg en \vee \neg F \wedge \neg z \rightarrow z\_\uparrow$$

$$en \wedge F \vee en \wedge z \rightarrow z\_\downarrow$$

Figure 8:
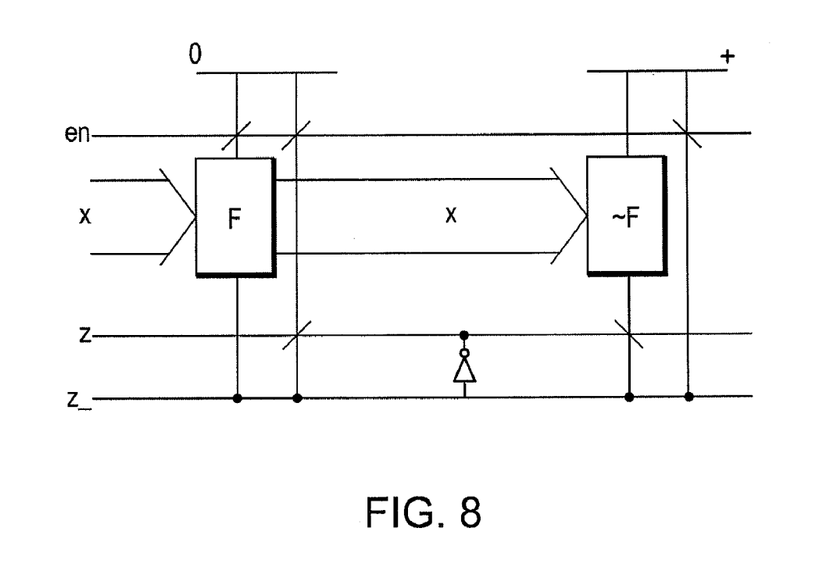
FIG. 8 is a schematic diagram for a function block with single output in which both Boolean expressions F and ~F are used to make the gate combinational, according to principles of the invention.

A symbolic layout is shown in FIG. 8. For example, if F is the dual-rail equality of a and b, i.e., $$f = a0 \wedge b0 \vee a1 \wedge b1,$$

the complement of F has to be implemented as $$\neg a0 \wedge \neg a1 \vee \neg b0 \wedge \neg a1 \vee \neg b1 \wedge \neg a0 \vee \neg b0 \wedge \neg b1,$$

since unfortunately we can only implement parallel or-terms. This leads to 5 parallel pullups. The added complexity may be significant. However, it should be observed that the added pullups and pulldowns are used only to maintain the value of the output in the floating state(s). Therefore, their possible complexity, which translates into a weak drive ($I_{ds}$ current), might be acceptable since those extra terms are not used to switch the output but only to zero the current value. However, the following simplification significantly improves the circuit. It applies whenever it is required to compute the dual-rail version of the function, that is,:

$$\neg en \rightarrow zt\_\uparrow \; \neg en \rightarrow zf\_\uparrow$$

$$en \wedge Ft \rightarrow zt\_\downarrow \; en \wedge Ff \rightarrow zf\_\downarrow$$

Figure 9:
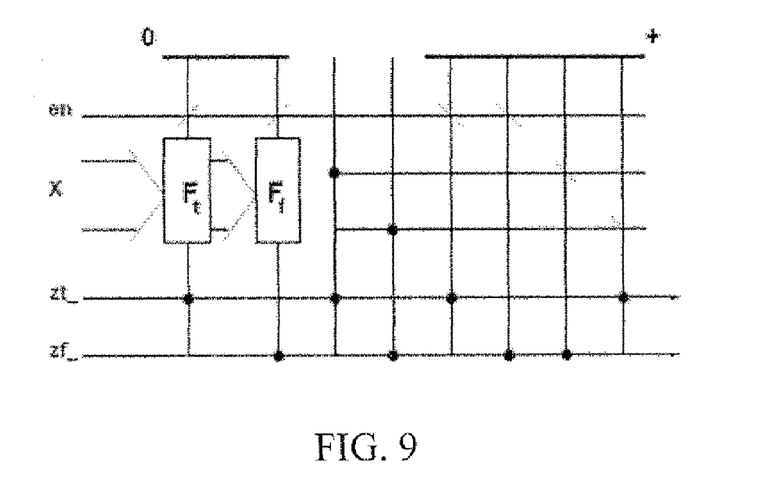
FIG. 9 is a schematic diagram for a dual-rail function block, according to principles of the invention.

If the only floating states are $en \wedge Ft \wedge \neg Ff$ for the $F_f$ block, and $en \wedge Ff \wedge \neg Ft$ for the Ft block, then we can staticize the production rules as:

$$\neg en \vee \neg zf \rightarrow zt\_\uparrow$$

$$\neg en \vee \neg zt \rightarrow zf\_\uparrow$$

with the pulldowns unchanged. This simplification requires that envFtvFf be an invariant of the system. In other words, the condition for applying the transformation is that the function inputs are not reset when en is set. A schematic nano-layout for this solution is shown in FIG. 9. Certain QDI templates already satisfy this condition. It is the ease for the control/data decomposition scheme of the pipeline stage used in the CAM. It relies on an easily satisfiable isochronicity assumption. Other QDI templates can easily be transformed to satisfy the invariant. It is the case for the precharge half-buffer ("PCHB") of the MiniMIPS design style. Since the validity (usually called v(L)) of the data input is always computed, it suffices to replace the enable signal en with en' defined as v(L)Cen (i.e. en' is the output of the C-element with en and v(L) as inputs).

Implementing an Adder

Figure 10:
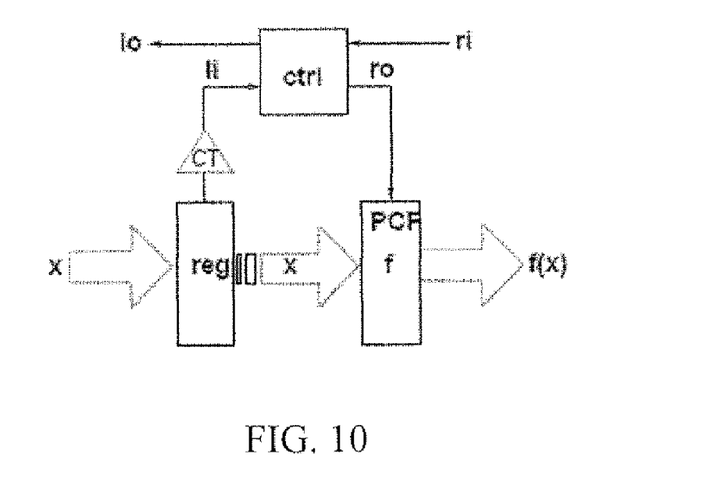
FIG. 10 is a schematic diagram that illustrates control/data decomposition of a pipeline stage, according to principles of the invention.
Figure 13:
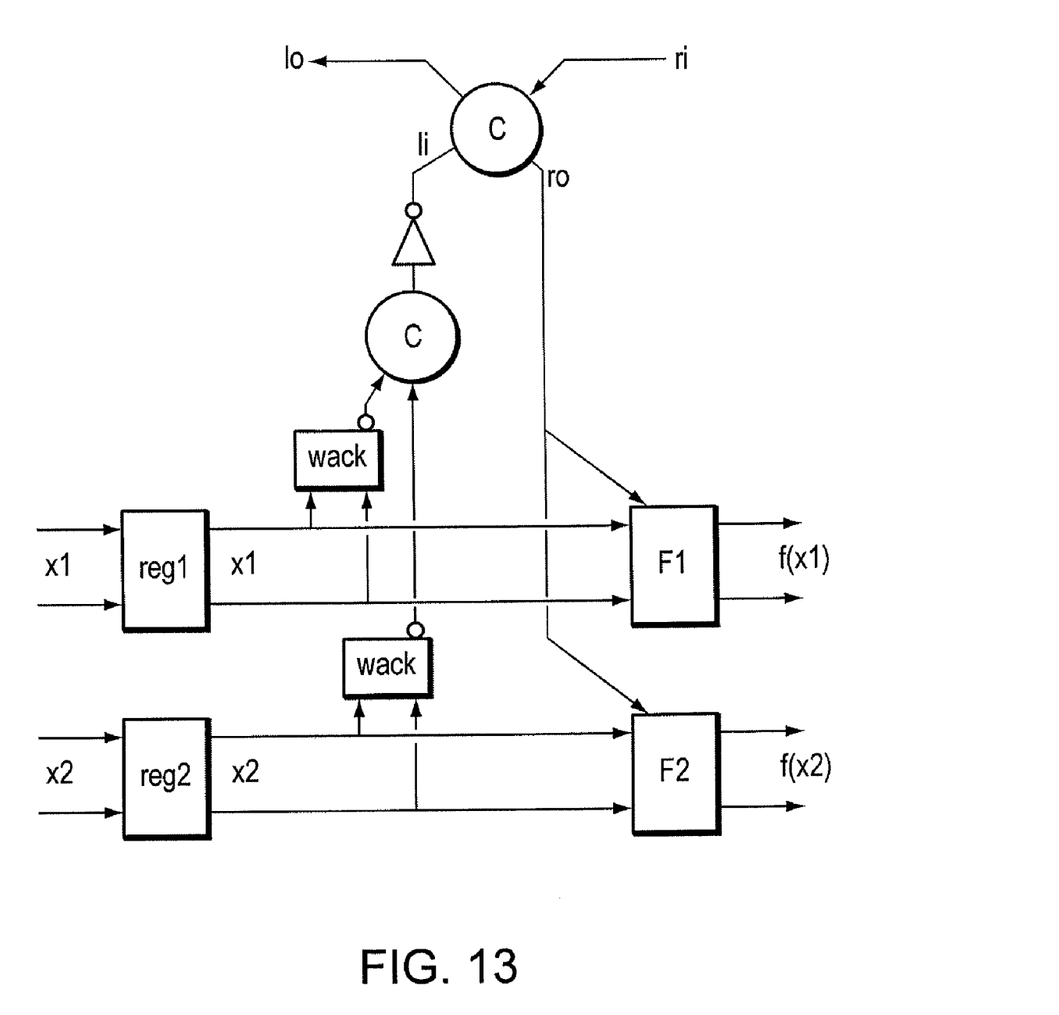
FIG. 13 is a schematic diagram that illustrates a control/data pipeline stage with half-buffer control, according to principles of the invention.

Having described the implementation of the components of QDI logic, we describe the implementation of an n-bit adder stage in nanoelectronics. The adder is designed in the same style as the Caltech Asynchronous Microprocessor. The basic QDI pipeline stage *[L?x; R!F(x)] can be implemented as in FIG. 10 using the control/data decomposition approach of the Caltech Asynchronous Microprocessor. See, for instance, A. J. Martin, M. Nystrom, Asynchronous Techniques for System-on-Chip Design, Proceedings of the IEEE, Special Issue on Systems-on-Chip, 94, 6, 1089-1120, 2006. As shown in the embodiment of FIG. 13, the control part can be implemented as a simple half-buffer (a simple C-element in this case). In the embodiment of FIG. 13 the datapath comprises a dual-rail register per bit of input with the two nand gates of the read part replaced by the precharge function-blocks computing the carry and sum for every pair of input bits.

In this design, the condition for removing staticizers is satisfied provided a mild isochronicity assumption is fulfilled, and therefore the function blocks for sum and carry can use the derived transformation. The isochronicity assumption is that the delay for the valid inputs to propagate from the outputs of the registers to the input of the function blocks should be less than the delay of the adversary path comprising the wacks (in parallel), the completion tree, and the C-element in the control.

Figure 11:
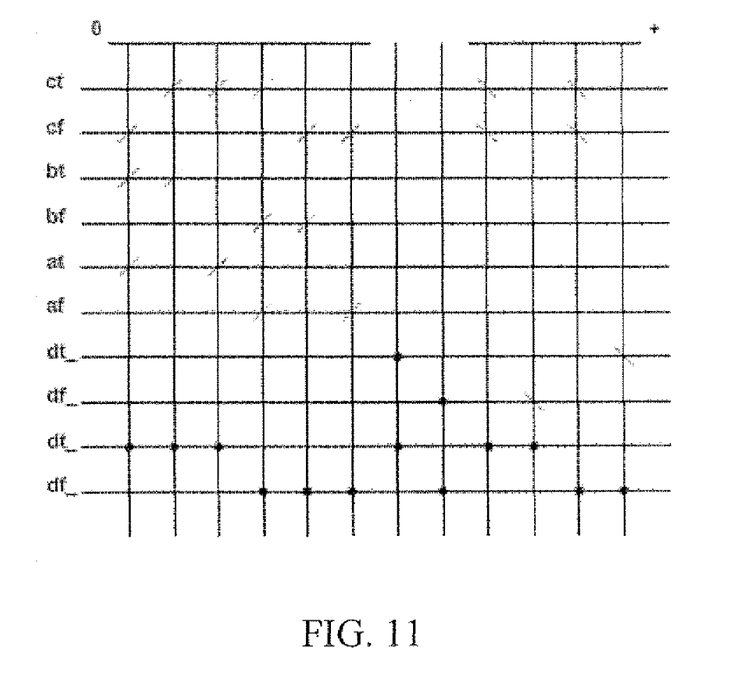
FIG. 11 is a schematic diagram that illustrates carry-out computation, according to principles of the invention.
Figure 12:
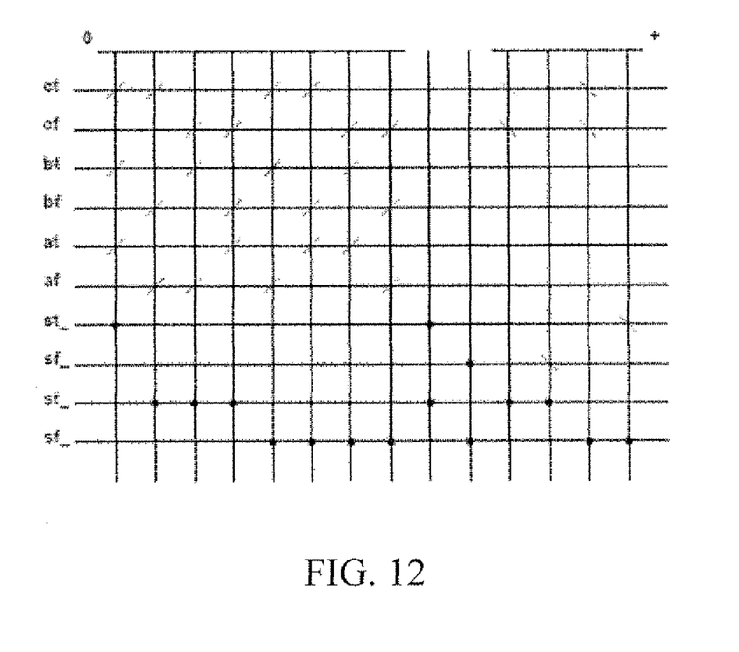
FIG. 12 is a schematic diagram that illustrates sum computation, according to principles of the invention.

Furthermore, in order to avoid propagating the control signal en (which is also ro in this case) to all bits of the datapath, we can replace en with ctvcf in all cells but the least significant one, where ct and $c_f$ are the pair of bits implementing the carry-in. The nano-layouts for the carry and sum functions are shown in FIG. 11 and FIG. 12. The production rules describing the pullups and pulldowns of the sum and carry cells are as follows. For the sum:

$$ct \wedge at \wedge bt \vee ct \wedge af \wedge bf \vee cf \wedge at \wedge bf \vee cf \wedge af \wedge bt \rightarrow st\_\downarrow$$

$$cf \wedge at \wedge bt \vee cf \wedge af \wedge bf \vee ct \wedge at \wedge bf \vee ct \wedge af \wedge bt \rightarrow sf\_\downarrow$$

$$\neg ct \wedge \neg cf \neg \vee sf\_ \rightarrow st\_\uparrow$$

$$\neg ct \wedge \neg cf \neg \vee st\_ \rightarrow sf\_\uparrow$$

For the carry-out:

$$cf \wedge at \wedge bt \vee ct \wedge at \vee ct \wedge bt \rightarrow dt\_\downarrow$$

$$ct \wedge af \wedge bf \vee cf \wedge af \vee cf \wedge bf \rightarrow df\_\downarrow$$

$$\neg ct \wedge \neg cf \vee \neg df\_ \rightarrow dt\_\uparrow$$

$$\neg cf \wedge \neg ct \vee \neg dt\_ \rightarrow df\_\uparrow$$

Isochronic Fork

Once we know how to construct all building blocks of QDI logic, the next step is to compose them into a working system. One aspect of building a system is assembling the nanotiles into a large layout. Another is the issue of isochronic forks. Given the wide timing variations to be expected in this technology, one question that needs to be resolved is whether we can satisfy the timing requirements of isochronic forks. The delay assumption associated with an isochronic fork is not a relation between the delays on the different branches of the fork (which would be a very tight assumption indeed). For example, in the case of a fork with two branches, if $\delta(t1)$ and $\delta(t2)$ are the respective delays of transition t1 on one branch and transition t2 on the other branch, the timing assumption is NOT that $|\delta(t1)-\delta(t2)| \leq \epsilon$. Such a timing requirement is sufficient but not necessary, and is very difficult to fulfill. Rather, the timing assumption on isochronic forks is one or several one-sided inequalities that can always be satisfied. The timing assumption requires that the delay of a single transition, say $\delta(t1)$ (the unacknowledged transition on an isochronic branch) be shorter that the sum of the delays on a multi-transition path which can be called the "adversary path." Because the isochronicity timing requirement is a one-sided inequality, it can always be satisfied (or rather made safer) by lengthening the adversary path.

We will not analyze all the possible different types of isochronic forks. Instead, we look at a worst-case example, where the adversary path contains just one gate. The example is the Caltech Q-element or the active-active buffer shown in FIG. 14.

Figure 14:
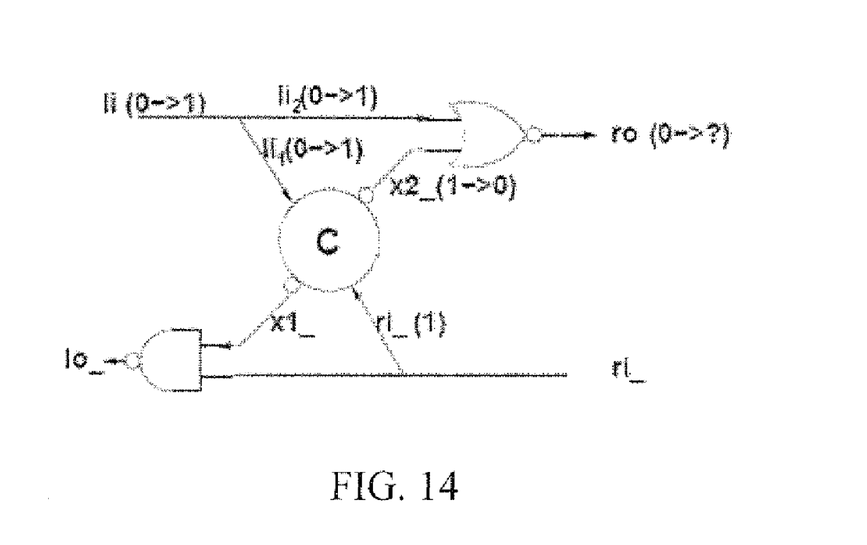
FIG. 14 is a schematic diagram that illustrates a fork (li, li1, li2) that is isochronic, with li2 as isochronic branch for the transition 0 to 1, according to principles of the invention.

We now analyze the isochronic fork (li, li1, li2). Initially, x2_ is true and ro is false. In order to satisfy the hand-shake specification, transition li↑ should not change the value of ro. But since the inverted output of the C-element is the input x2_ of the nor-gate, the adversary path (li1, C-element, x2_) causes transition x2↓, which could cause transition $r_o$↑, unless the isochronic-branch transition li2↑ terminates before x2_↓. This is one of the tightest isochronicity requirements since the adversary path contains only one gate, the C-element. Since the C-element is used with an inverted output in this cell, in CMOS the output could be taken before the inverter if the C-element is implemented with a staticizer. However, in an implementation of the C-element as a majority gate, the inverted output has to be taken after two inverters, making the adversary path longer and safer.

Figure 15:
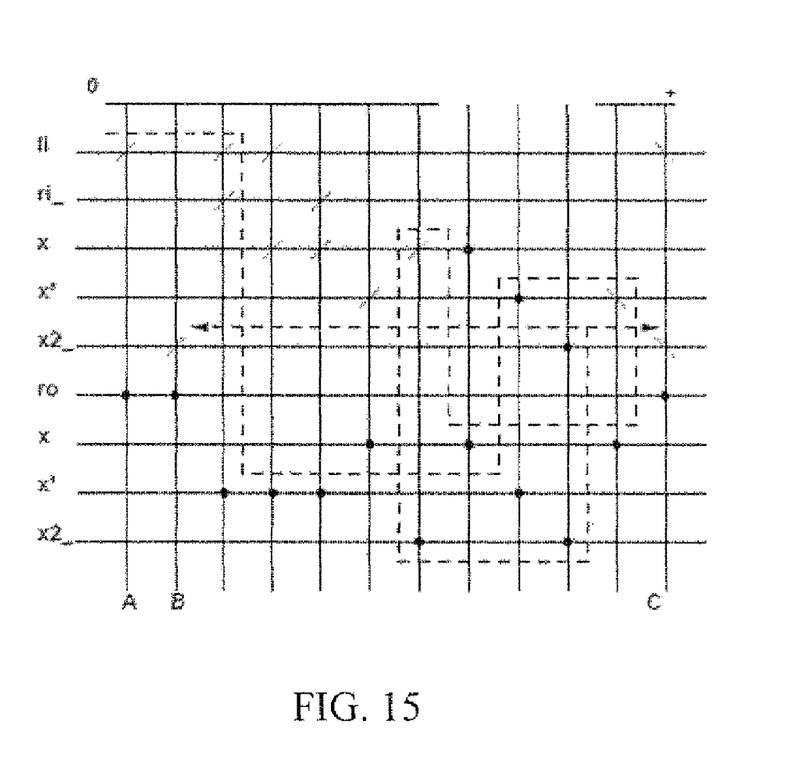
FIG. 15 is a schematic diagram that illustrates a partial layout showing the adversary path in dotted line, according to principles of the invention.

The nano-layout schematic shown in FIG. 15 illustrates the implementation of the C-element with the two inverters, and the nor-gate. The nand-gate is omitted. The isochronicity requirement translates as follows. Initially the voltage on x2_ is high and there is a path from GND to ro along the pulldown B. When the voltage on li rises, the pulldown A from GND to ro must be tied by the n-transistor with gate li and the pullup C must be cut by the p-transistor with gate li before the adversary path, marked by a dotted line on the figure, cuts pulldown B by the n-transistor with gate x2_ and ties pullup C by the p-transistor with gate x2_.

Keeping the isochronic-branch delay short requires that the layout discipline does not add extra delay through long and/or resistive wires or by connection resistances. The layout rule that places the n-plane and p-plane side by side allows the same metal wire to be used for all branches of the same isochronic fork provided it all fits within the length constraint of a metal nano-wire. This layout rule eliminates all extra delays on the isochronic branch besides the transition delay. Furthermore, the transformation that eliminates the staticizer helps make all transition delays of similar length by pushing the transition voltage towards $V_{dd}/2$.

With this precaution, the timing requirement for this example is that a single transition delay on a single metal wire of the isochronic branch must be shorter than 3 transition delays plus 9 RC delays of contacts and wires for the adversary path. This timing requirement, which is a worst-case, should not be difficult to fulfill.

We have established the existence of an efficient QDI logic family given the strict design rules and large parameter variations of our target nanotechnology. An interesting by-product is to show that there exist efficient static implementations of state-holding elements without weak feedback and with no more than two transistors in series in the pullups. Such an approach is expected to be of interest for "extreme nano-CMOS" as well. An important point concerning the implementability of QDI has not been addressed yet.

We need to make sure that the rings of restoring gates composing a QDI system keep oscillating, since a QDI system is nothing more than an interlocking set of oscillating rings. Such an analysis will require a more precise knowledge of the gain of transistors in the chosen technology than is known at the time of this writing.

Several other issues have not been addressed:

1. As up to 10% of the devices will be unusable, because of a broken wire, a stuck open contact, etc. Therefore, defect tolerance is an integral part of the design. Preliminary investigation leads us to believe that satisfactory strategies exist.
2. For the usual density reasons, memory requires specialized design. Small memories have already been demonstrated.
3. Input and output, as well as power supply, will be done at a microlevel, e.g., CMOS. How to connect nanowires to the microlevel CMOS connections without sacrificing the nanopitch is a separate issue. Several solutions already exist.

General Purpose Programmable Computers

General purpose programmable computers useful for controlling instrumentation, recording signals and analyzing signals or data according to the present description can be any of a personal computer (PC), a microprocessor based computer, a portable computer, or other type of processing device. The general purpose programmable computer typically comprises a central processing unit, a storage or memory unit that can record and read information and programs using machine-readable storage media, a communication terminal such as a wired communication device or a wireless communication device, an output device such as a display terminal, and an input device such as a keyboard. The display terminal can be a touch screen display, in which case it can function as both a display device and an input device. Different and/or additional input devices can be present such as a pointing device, such as a mouse or a joystick, and different or additional output devices can be present such as an enunciator, for example a speaker, a second display, or a printer. The computer can run any one of a variety of operating systems, such as for example, any one of several versions of Windows, or of MacOS, or of Unix, or of Linux.

Machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, or alternatively SD or SDIO memory; and the electronic components (e.g., floppy disk drive, DVD drive, CD/CD-R/CD-RW drive, or Compact Flash/PCMCIA/SD adapter) that accommodate and read from and/or write to the storage media. As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Well known older machine-readable media are also available for use under certain conditions, such as punched paper tape or cards, magnetic recording on tape or wire, optical or magnetic reading of printed characters (e.g., OCR and magnetically encoded symbols) and machine-readable symbols such as one and two dimensional bar codes.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

While the present invention has been particularly shown and described with reference to the structure and methods disclosed herein and as illustrated in the drawings, it is not confined to the details set forth and this invention is intended to cover any modifications and changes as may come within the scope and spirit of the following claims.

What is claimed is:

1. An asynchronous nanoelectronic circuit configured to operate according to quasi-delay insensitive principles, comprising:
    a compute tile having an n-plane, a p-plane and a routing plane, said compute tile including at least a first logic element and a second logic element, said first logic element having at least a first input and at least a first output, said second logic element having at least a second input and at least a second output, said first input and said second input each configured to receive an input signal, said first output and said second output each configured to be connected to one of a high reference voltage via a pullup element and a low reference voltage via a pulldown element; and
    a state-holding element connected to at least one of said first output and said second output, said state-holding element comprising a selected one of a C-element, a precharge function-block, and a read-write register, said state-holding element configured to hold steady a state of at least one of said first output and said second output during a time when at least one of said first output and said second output is disconnected from a respective one of said high reference voltage and said low reference voltage;
    said asynchronous nanoelectronic circuit configured to provide a computationally stable output according to quasi-delay insensitive principles.

2. The asynchronous nanoelectronic circuit configured to operate according to quasi-delay insensitive principles of claim 1, wherein said precharge function-block comprises a state holding cell having an enable input en and one or more inputs for computing a Boolean function.

3. The asynchronous nanoelectronic circuit configured to operate according to quasi-delay insensitive principles of claim 1, wherein said read-write register comprises a set/reset latch having at least two inputs and configured to hold one of two binary values; at least two output elements connected to said set/reset latch, said two output elements configured to provide an output signal and its complement; and a write-acknowledge element, said write-acknowledge element configured to provide a write-acknowledge signal.

4. The asynchronous nanoelectronic circuit configured to operate according to quasi-delay insensitive principles of claim 1, wherein each of said first logic element and said second logic element comprise a crossbar having a first wire in a first direction superimposed over a second wire in a second direction orthogonal to the first direction and at least one molecule situated between said first wire and said second wire, said molecule configured to change a conductive state between said first wire and said second wire in response to an applied voltage signal.

5. The asynchronous nanoelectronic circuit configured to operate according to quasi-delay insensitive principles of claim 4, wherein said at least one molecule is a rotaxane molecule.

6. The asynchronous nanoelectronic circuit configured to operate according to quasi-delay insensitive principles of claim 1, wherein each of said first logic element and said second logic element comprise a crossbar having a first wire in a first direction superimposed over a second wire in a second direction orthogonal to the first direction, wherein at least one of said first and said second wires is a doped silicon nanowire.

7. The asynchronous nanoelectronic circuit configured to operate according to quasi-delay insensitive principles of claim 1, wherein a selected one of said first logic element and said second logic element is a selected one of a transistor, a diode and a resistor.

8. The asynchronous nanoelectronic circuit configured to operate according to quasi-delay insensitive principles of claim 1, wherein said tile comprises as many as 10,000 logic elements.

9. The asynchronous nanoelectronic circuit configured to operate according to quasi-delay insensitive principles of claim 1, wherein said circuit is configured to provide a single-bit register.

10. The asynchronous nanoelectronic circuit configured to operate according to quasi-delay insensitive principles of claim 1, wherein said circuit is configured to provide a sum cell.

11. The asynchronous nanoelectronic circuit configured to operate according to quasi-delay insensitive principles of claim 1, wherein said circuit is configured to provide a carry cell.

12. The asynchronous nanoelectronic circuit configured to operate according to quasi-delay insensitive principles of claim 1, wherein said circuit is configured to provide an adder.

13. The asynchronous nanoelectronic circuit configured to operate according to quasi-delay insensitive principles of claim 1, wherein said circuit is configured to provide a logic cell.

* * * * *